(12) United States Patent
Masuda

(10) Patent No.: US 10,848,120 B2
(45) Date of Patent: Nov. 24, 2020

(54) MULTILAYER LC FILTER

(71) Applicant: Murata Manufacturing Co., Ltd., Nagaokakyo (JP)

(72) Inventor: Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/390,099

(22) Filed: Apr. 22, 2019

(65) Prior Publication Data

US 2019/0245506 A1 Aug. 8, 2019

Related U.S. Application Data

(63) Continuation of application No. PCT/JP2017/036191, filed on Oct. 4, 2017.

(30) Foreign Application Priority Data

Nov. 7, 2016 (JP) .................................. 2016-217259

(51) Int. Cl.
| | |
|---|---|
| *H03H 7/09* | (2006.01) |
| *H03H 7/01* | (2006.01) |
| *H01F 27/00* | (2006.01) |
| *H01F 17/00* | (2006.01) |
| *H01F 27/29* | (2006.01) |
| *H03H 1/00* | (2006.01) |

(52) U.S. Cl.
CPC ........... *H03H 7/09* (2013.01); *H01F 17/0013* (2013.01); *H01F 27/00* (2013.01); *H01F 27/292* (2013.01); *H03H 7/0115* (2013.01); *H03H 7/1741* (2013.01); *H01F 2017/0026* (2013.01); *H03H 2001/0085* (2013.01)

(58) Field of Classification Search
CPC . H03H 2001/0085; H03H 7/09; H03H 7/0115
USPC ................................................ 333/175, 185
See application file for complete search history.

(56) References Cited

U.S. PATENT DOCUMENTS

| | | | |
|---|---|---|---|
| 2003/0048156 A1 | 3/2003 | Uriu et al. | |
| 2013/0229241 A1* | 9/2013 | Imamura | ............ H01P 1/20345 |
| | | | 333/185 |

(Continued)

FOREIGN PATENT DOCUMENTS

| | | |
|---|---|---|
| JP | 2006-269653 A | 10/2006 |
| JP | 2007-159069 A | 6/2007 |

(Continued)

OTHER PUBLICATIONS

Official Communication issued in International Patent Application No. PCT/JP2017/036191 dated Dec. 26, 2017.

*Primary Examiner* — Rakesh B Patel
(74) *Attorney, Agent, or Firm* — Keating & Bennett, LLP

(57) ABSTRACT

A multilayer body includes a first inductor and a second inductor provided in a first planar region, and a third inductor and a fourth inductor provided in a second planar region when viewed in a lamination direction of dielectric layers of the multilayer body. When the multilayer body is viewed in a direction perpendicular or substantially perpendicular to the lamination direction of the dielectric layers, the first inductor and the fourth inductor are provided in a first thickness region, and the second inductor and the third inductor are provided in a second thickness region.

6 Claims, 9 Drawing Sheets

(56) References Cited

U.S. PATENT DOCUMENTS

2014/0077895 A1 3/2014 Imamura
2018/0013395 A1 1/2018 Asada

FOREIGN PATENT DOCUMENTS

| JP | 2014-057277 A | 3/2014 |
| WO | 02/09225 A1 | 1/2002 |
| WO | 2016/152211 A1 | 9/2016 |

* cited by examiner

MULTILAYER LC FILTER

CROSS REFERENCE TO RELATED APPLICATIONS

This application claims the benefit of priority to Japanese Patent Application No. 2016-217259 filed on Nov. 7, 2016 and is a Continuation Application of PCT Application No. PCT/JP2017/036191 filed on Oct. 4, 2017. The entire contents of each application are hereby incorporated herein by reference.

BACKGROUND OF THE INVENTION

1. Field of the Invention

The present invention relates to a multilayer LC filter in which four LC parallel resonators are provided inside a multilayer body in which a plurality of dielectric layers are laminated, and more particularly, to a multilayer LC filter that has desired frequency characteristics obtained by necessary magnetic coupling between inductors defining the LC parallel resonators being appropriately performed, and has a reduced height.

2. Description of the Related Art

A multilayer LC filter in which an LC parallel resonator defined by an inductor and a capacitor is formed inside a multilayer body where a plurality of dielectric layers is laminated, is used in various electronic devices. Such a multilayer LC filter is disclosed in Japanese Unexamined Patent Application Publication No. 2014-57277.

FIG. 9 illustrates a multilayer LC filter (high frequency filter) 1000 disclosed in Japanese Unexamined Patent Application Publication No. 2014-57277. The multilayer LC filter 1000 includes a multilayer body 101 in which eight layers, that is, dielectric layers (insulator layers) 101a to 101h are laminated. On a lower-side main surface of the dielectric layer 101a, there are formed a first input/output terminal (outer electrode) 102a, a second input/output terminal (outer electrode) 102b and a ground terminal (outer electrode) 103. Two capacitor conductor patterns (resonance capacitance conductors) 104a and 104b are provided on an upper-side main surface of the dielectric layer 101b. In addition, six via conductors 105a to 105f are formed in the dielectric layer 101b. A ground conductor pattern (ground conductor) 106 is provided on an upper-side main surface of the dielectric layer 101c.

Four via conductors, that is, the via conductors 105c to 105f described above are formed in the dielectric layer 101c. Further, two via conductors 105g and 105h are additionally formed in the dielectric layer 101c. Note that the via conductors which are formed in different dielectric layers and to which the same reference sign is given, are connected to each other. For example, the via conductor 105c formed in the dielectric layer 101b and the via conductor 105c formed in the dielectric layer 101c are connected to each other, and for convenience of explanation, the same reference sign is given to them (hereinafter, the same applies in this specification).

Two capacitor conductor patterns 104c and 104d are provided on an upper-side main surface of the dielectric layer 101d. Two via conductors, that is, the via conductors 105g and 105h are formed in the dielectric layer 101d. Further, four via conductors 105i to 105l are additionally formed in the dielectric layer 101d. A floating conductor 107 is provided on an upper-side main surface of the dielectric layer 101e. The floating conductor 107 is a conductor used for capacitively coupling a first LC parallel resonator LC1 and a fourth LC parallel resonator LC4 to be described later.

Six via conductors, that is, the via conductors 105g to 105l are formed in the dielectric layer 101e. Further, two via conductors 105m and 105n are additionally formed in the dielectric layer 101e. Four inductor conductor patterns 108a to 108d are provided on an upper-side main surface of the dielectric layer 101f. Eight via conductors, that is, the via conductors 105g to 105n are formed in the dielectric layer 101f. Four inductor conductor patterns 108e to 108h are provided on an upper-side main surface of the dielectric layer 101g. Eight via conductors, that is, the via conductors 105g to 105n described above are formed in the dielectric layer 101g.

The dielectric layer 101h is a protective layer, where neither a conductor pattern nor a via conductor is formed. The first input/output terminal 102a and the capacitor conductor pattern 104a are connected by the via conductor 105a. The second input/output terminal 102b and the capacitor conductor pattern 104b are connected by the via conductor 105b. Further, the ground terminal 103 and the ground conductor pattern 106 are connected by the four via conductors 105c to 105f.

In the multilayer LC filter 1000, the first LC parallel resonator LC1, a second LC parallel resonator LC2, a third LC parallel resonator LC3, and the fourth LC parallel resonator LC4 are formed inside the multilayer body 101. Hereinafter, the configuration of each LC parallel resonator will be described.

The via conductor 105g, the inductor conductor patterns 108a and 108e, and the via conductor 105i are connected, so that a loop-shaped first inductor is formed between the capacitor conductor pattern 104a and the ground conductor pattern 106. The capacitor conductor pattern 104a and the ground conductor pattern 106 form a first capacitor. Then, the first inductor and the first capacitor are connected in parallel to form the first LC parallel resonator LC1. In the first inductor, by connecting the two inductor conductor patterns 108a and 108e as a set, internal resistance is lowered and the Q value is improved (the same applies to a second inductor through a fourth inductor to be described later).

The via conductor 105m, the inductor conductor patterns 108b and 108f, and the via conductor 105j are connected, so that a loop-shaped second inductor is formed between the capacitor conductor pattern 104c and the ground conductor pattern 106. The capacitor conductor pattern 104c and the ground conductor pattern 106 form a second capacitor. Then, the second inductor and the second capacitor are connected in parallel to form the second LC parallel resonator LC2.

The via conductor 105n, the inductor conductor patterns 108c and 108g, and the via conductor 105k are connected, so that a loop-shaped third inductor is formed between the capacitor conductor pattern 104d and the ground conductor pattern 106. In addition, the capacitor conductor pattern 104d and the ground conductor pattern 106 form a third capacitor. Then, the third inductor and the third capacitor are connected in parallel to form the third LC parallel resonator LC3.

The via conductor 105h, the inductor conductor patterns 108d and 108h, and the via conductor 105l are connected, so that a loop-shaped fourth inductor is formed between the capacitor conductor pattern 104b and the ground conductor pattern 106. In addition, the capacitor conductor pattern 104b and the ground conductor pattern 106 form a fourth capacitor. Then, the fourth inductor and the fourth capacitor are connected in parallel to form the fourth LC parallel resonator LC4.

In the multilayer LC filter 1000, the first LC parallel resonator LC1 through the fourth LC parallel resonator LC4 are formed inside the multilayer body 101, the inductors of the LC parallel resonators are magnetically coupled to each other as described below, and capacitive coupling (capacitive coupling between the first LC parallel resonator LC1 and the fourth LC parallel resonator LC4 by the floating conductor 107) is added as needed, thereby constituting a four-stage LC band pass filter having desired frequency characteristics.

In the multilayer LC filter 1000, the inductors of the LC parallel resonators adjacent to each other are magnetically coupled to each other. In other words, the first inductor and the second inductor are magnetically coupled to each other. The second inductor and the third inductor are magnetically coupled to each other. The third inductor and the fourth inductor are magnetically coupled to each other.

Further, in the multilayer LC filter 1000, the inductors of the LC parallel resonators separate from each other are also magnetically coupled to each other. In other words, the first inductor and the third inductor are magnetically coupled to each other. The first inductor and the fourth inductor are magnetically coupled to each other. The second inductor and the fourth inductor are magnetically coupled to each other.

In the multilayer LC filter 1000, each of the first to fourth inductors is defined by the inductor having a loop via structure in which a via conductor, an inductor conductor pattern, and another via conductor are sequentially connected in loop form, and when the multilayer body 101 is seen in an end surface direction, air-core portions of the first to fourth inductors are so arranged as to overlap with each other. This structure this makes it possible for even the inductors of the separated LC parallel resonators to be magnetically coupled to each other with ease.

Magnetically coupling the inductors of the separated LC parallel resonators is very important for obtaining desired frequency characteristics. By magnetically coupling the first and third inductors, and by magnetically coupling the second and fourth inductors, it is possible to form a desired pole in the frequency characteristics, and to adjust input/output impedance. Further, by magnetically coupling the first and fourth inductors, it is possible to form a desired pole in the frequency characteristics.

In recent years, electronic apparatuses, such as a smartphone, a tablet computer, a cellular phone, and a portable music player have been required to be thinner in the market, and the thinning of such apparatuses has rapidly progressed. As the electronic apparatuses have become thinner, electronic components used in the electronic apparatuses are also strongly required to be reduced in height (be thinned), and a multilayer LC filter is not an exception to this trend.

However, the multilayer LC filter 1000 described in Japanese Unexamined Patent Application Publication No. 2014-57277 has a problem that it is difficult to reduce its height because the first to fourth inductors are each defined by an inductor having a loop via structure in which the via conductor, the inductor conductor pattern and the via conductor are sequentially connected in loop form. This will be briefly explained below.

In an inductor having a loop via structure in which a via conductor, an inductor conductor pattern, and another via conductor are sequentially connected in a loop shape, a length of the via conductor largely contributes to the creation of an inductance value, and when the via conductor is shortened, a diameter of the inductor is reduced so that the inductance value thereof is decreased. When it is attempted to lower the height of the multilayer LC filter 1000, it is necessary to decrease the number of layers of the dielectric layers 101a to 101h defining the multilayer body 101, to reduce the thickness of each of the dielectric layers, or the like, which brings about a situation in which the via conductors 105g to 105n need to be shortened. However, as described above, in the case where the via conductors 105g to 105n are shortened, since each of the first to fourth inductors having the loop via structure comes to have a lowered inductance value, the multilayer LC filter 1000 cannot obtain the desired frequency characteristics. In other words, since the first to fourth inductors are each defined by the inductor having a loop via structure, the desired frequency characteristics cannot be obtained when the height of the multilayer LC filter 1000 is lowered. Accordingly, it is difficult to lower the height of the multilayer LC filter 1000.

In order to lower the height of the multilayer LC filter, it is necessary to provide the inductor of each LC parallel resonator with an inductor having a structure independent of (or not largely dependent on) the length of the via conductor. For example, by defining the inductor of each LC parallel resonator with an inductor configured of an inductor conductor pattern that is wound to have a plurality of turns in a planar direction, a necessary inductance value can be obtained, and even if the multilayer LC filter is reduced in height, the inductance value is not lowered. Alternatively, by defining the inductor of each LC parallel resonator by an inductor having a structure in which a plurality of C-shaped inductor conductor patterns is formed in adjacent interlaminar areas of the dielectric layers and is connected by via conductors, a necessary inductance value can be obtained, and even if the multilayer LC filter is reduced in height, the inductance value is hardly lowered.

However, in the case in which the inductor of each LC parallel resonator is defined by an inductor configured by an inductor conductor pattern that is wound to have a plurality of turns in the planar direction, or by an inductor having a structure in which a plurality of C-shaped inductor conductor patterns is connected by via conductors, there arises another problem that it is difficult to magnetically couple the inductors of the separated LC parallel resonators with desired strength. For example, in the case where the inductor of each of the first LC parallel resonator to the fourth LC parallel resonator is defined by an inductor configured by an inductor conductor pattern that is wound to have a plurality of turns in the planar direction in one interlaminar area of the dielectric layers, and is disposed being aligned in the planar direction, there arises a problem as follows: although the adjacent inductors can be magnetically coupled to each other, the inductors separated from each other cannot be magnetically coupled with desired strength. Further, in the case where the inductor of each of the first to fourth LC parallel resonators is defined by an inductor having a structure in which a plurality of C-shaped inductor conductor patterns is connected by via conductors, and is disposed being aligned in the planar direction, there arises a problem as follows: although the adjacent inductors can be magnetically coupled to each other, the inductors separated from each other cannot be magnetically coupled with desired strength. That is, for example, in the multilayer LC filter 1000 described in Japanese Unexamined Patent Application Publication No. 2014-57277, the reason why the inductors of the separated LC parallel resonators can be magnetically coupled to each other is such that the respective air-core portions of the first to fourth inductors are arranged to overlap with each other when the multilayer body 101 is seen in the end surface direction. On the other hand, in the case in which the inductor of each of the LC parallel resonators is defined by an inductor configured of an inductor conductor pattern that is wound to have a plurality of turns in the planar direction or by an inductor having a structure in which a plurality of C-shaped inductor conductor patterns is connected by via conductors, and is disposed being aligned in the planar direction, there arises a problem as follows: although the inductors of the adjacent LC parallel resonators can be magnetically coupled to each other because these inductors are close to each other in distance, the inductors of the separated LC parallel resonators cannot be magnetically coupled to each other with desired strength because the air-core portions of the inductors do not overlap with each other. That is, even though the inductors of the separated LC parallel resonators can be magnetically coupled to each other, there is a problem that they are magnetically coupled with weaker strength than the desired one.

As described earlier, magnetically coupling the inductors of the separated LC parallel resonators is very important for obtaining the desired frequency characteristics.

In the case in which the inductor of each LC parallel resonator is defined by an inductor configured of an inductor conductor pattern that is wound to have a plurality of turns in the planar direction, or by an inductor having a structure in which a plurality of C-shaped inductor conductor patterns is connected by via conductors, there is an advantage that the inductance value is not lowered even if the multilayer LC filter is reduced in height. However, there is a problem that the inductors of the separated LC parallel resonators cannot be magnetically coupled to each other with desired strength and the desired frequency characteristics cannot be obtained.

SUMMARY OF THE INVENTION

Preferred embodiments of the present invention p solve the above-described problems. Specifically, a preferred embodiment of the present invention includes a multilayer body having a rectangular or substantially rectangular parallelepiped shape in which a plurality of dielectric layers are laminated; a first input/output terminal and a second input/output terminal provided on an outer surface of the multilayer body; at least one ground terminal provided on the outer surface of the multilayer body; a plurality of inductor conductor patterns provided in interlaminar areas of the dielectric layers; a plurality of capacitor conductor patterns provided in interlaminar areas of the dielectric layers; and at least one ground conductor pattern provided in an interlaminar area of the dielectric layers. A first inductor, a second inductor, a third inductor, and a fourth inductor are each defined by the inductor conductor pattern; a first capacitor, a second capacitor, a third capacitor, and a fourth capacitor are each defined by capacitance generated between the capacitor conductor pattern and the ground conductor pattern; the first inductor and the first capacitor are connected in parallel to define a first LC parallel resonator, the second inductor and the second capacitor are connected in parallel to define a second LC parallel resonator, the third inductor and the third capacitor are connected in parallel to define a third LC parallel resonator, and the fourth inductor and the fourth capacitor are connected in parallel to define a fourth LC parallel resonator; the first LC parallel resonator, the second LC parallel resonator, the third LC parallel resonator, and the fourth LC parallel resonator are connected in this order between the first input/output terminal and the second input/output terminal to define a four-stage multilayer LC filter; the multilayer body includes a first planar region and a second planar region when viewed in a lamination direction of the dielectric layers; the multilayer body includes a first thickness region and a second thickness region each having a predetermined thickness in the lamination direction of the dielectric layers when viewed in a direction perpendicular or substantially perpendicular to the lamination direction of the dielectric layers; when the multilayer body is seen in the lamination direction of the dielectric layers, the first inductor and the second inductor are provided in the first planar region, and the third inductor and the fourth inductor are provided in the second planar region; and when the multilayer body is seen in a direction perpendicular or substantially perpendicular to the lamination direction of the dielectric layers, the first inductor and the fourth inductor are provided in the first thickness region and the second inductor and the third inductor are provided in the second thickness region, or the first inductor and the third inductor are provided in the first thickness region and the second inductor and the fourth inductor are provided in the second thickness region.

It is preferable that the first inductor and the fourth inductor are provided in the first thickness region and the second inductor and the third inductor are provided in the second thickness region, and that one end of the inductor conductor pattern defining the second inductor and one end of the inductor conductor pattern defining the third inductor are connected to each other and then are connected to the ground terminal. In this case, it is possible to strengthen the magnetic coupling between the second inductor and the third inductor, and to widen the bandwidth of the pass band.

The first thickness region may be provided on a side closer to one main surface of the multilayer body, and the second thickness region may be provided on an interior side of the multilayer body. Alternatively, the second thickness region may be provided on the side closer to the one main surface of the multilayer body, and the first thickness region may be provided on the interior side of the multilayer body.

It is preferable that the multilayer body further include, in addition to the first thickness region and the second thickness region, a third thickness region when viewed in a direction perpendicular or substantially perpendicular to the lamination direction of the dielectric layers; the first thickness region, the second thickness region, and the third thickness region are disposed in this order in the lamination direction of the dielectric layers; when the multilayer body is seen in the direction perpendicular or substantially perpendicular to the lamination direction of the dielectric layers, the first inductor and the fourth inductor are provided in the first thickness region, the second inductor and the third inductor are provided in the second thickness region, and the first capacitor, the second capacitor, the third capacitor and the fourth capacitor are provided in the third thickness region; the first inductor and the first capacitor of the first LC parallel resonator are connected via the first input/output terminal and the ground terminal respectively provided on the outer surface of the multilayer body; and the fourth inductor and the fourth capacitor of the fourth LC parallel resonator are connected via the second input/output terminal and the ground terminal respectively provided on the outer surface of the multilayer body. In a case in which the first inductor and the first capacitor of the first LC parallel resonator are connected by a via conductor additionally provided in the second thickness region, and not by the first input/output terminal and the ground terminal, and the fourth inductor and the fourth capacitor of the fourth LC parallel resonator are connected by a via conductor additionally provided in the second thickness region, and not by the second input/output terminal and the ground terminal, there arises a problem that, because space is occupied by the via conductors additionally provided in the second thickness region, the second inductor and the third inductor provided in the second thickness region must be miniaturized resulting in the inductance values of the second inductor and third inductor being reduced. To deal with this problem, as discussed above, since the first inductor and the first capacitor of the first LC parallel resonator are connected by the first input/output terminal and the ground terminal provided on the outer surface of the multilayer body, and the fourth inductor and the fourth capacitor of the fourth LC parallel resonator are connected by the second input/output terminal and the ground terminal provided on the outer surface of the multilayer body, it is possible to avoid the miniaturization of the second inductor and the third inductor provided in the second thickness region.

It is preferable that, when the multilayer body is seen in the lamination direction of the dielectric layers, an air-core portion of the first inductor and an air-core portion of the second inductor at least partially overlap each other; a section where the air-core portion of the first inductor and the air-core portion of the second inductor overlap each other overlap neither the capacitor conductor pattern nor the ground conductor pattern, or overlap the capacitor conductor pattern or the ground conductor pattern partially but not completely; an air-core portion of the third inductor and an air-core portion of the fourth inductor at least partially overlap each other; and a section where the air-core portion of the third inductor and the air-core portion of the fourth inductor overlap each other overlap neither the capacitor conductor pattern nor the ground conductor pattern, or overlap the capacitor conductor pattern or the ground conductor pattern partially but not completely. In this case, magnetic flux generation of each of the first inductor to the fourth inductor is not reduce or prevented by the capacitor conductor pattern and the ground conductor pattern, the Q value of each of the first inductor to the fourth inductor is large, and insertion loss of the multilayer LC filter is small.

In the multilayer LC filters of preferred embodiments of the present invention, in addition to the magnetic coupling between the first inductor and the second inductor, the magnetic coupling between the second inductor and the third inductor, and the magnetic coupling between the third inductor and the fourth inductor, the magnetic coupling between the first inductor and the third inductor, the magnetic coupling between the first inductor and the fourth inductor, and the magnetic coupling between the second inductor and the fourth inductor are achieved, respectively, such that the multilayer LC filter has desired frequency characteristics in which a necessary pole is provided and input/output impedance is matched. Also, even if the height of the multilayer LC filters of preferred embodiments of the present invention is reduced, the inductance values of the first inductor, the second inductor, the third inductor, and the fourth inductor do not decrease (hardly decrease).

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
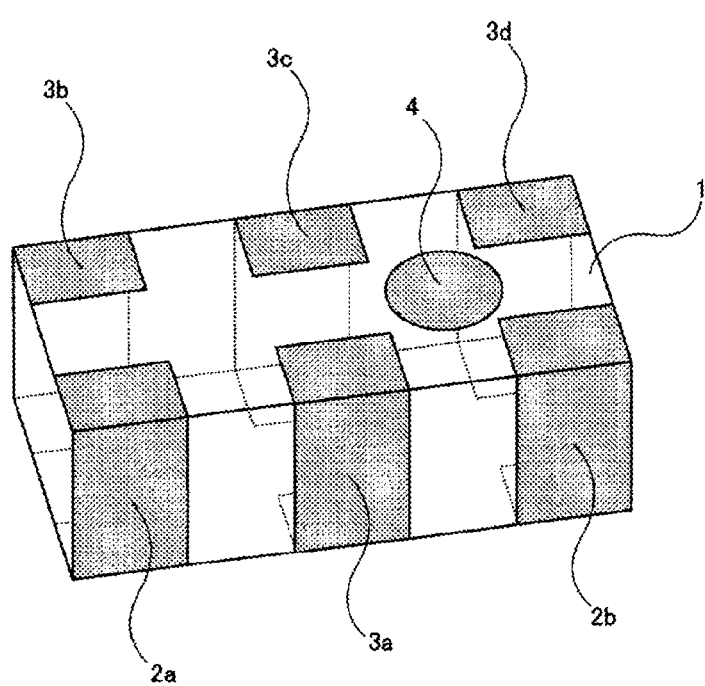
FIG. 1 is a perspective view of a multilayer LC filter 100 according to a first preferred embodiment of the present invention.

Hereinafter, preferred embodiments of the present invention will be described with reference to the accompanying drawings. Note that each of the following preferred embodiments is intended to illustratively describe the preferred embodiments of the present invention, and the present invention is not limited to the contents of the preferred embodiments. It is also possible to implement the present invention by combining the contents described in different preferred embodiments, and the contents of the implementation of such cases are also included in the present invention. Note that the drawings are intended to facilitate understanding of the specification and may be in schematic, so that the ratio of dimensions of the elements or the ratio of dimensions between the elements may not be consistent with the ratio of those dimensions described in the specification. Further, some elements described in the specification may be omitted in the drawings, or a reduced number of them may be shown in the drawings.

First Preferred Embodiment

Figure 2:
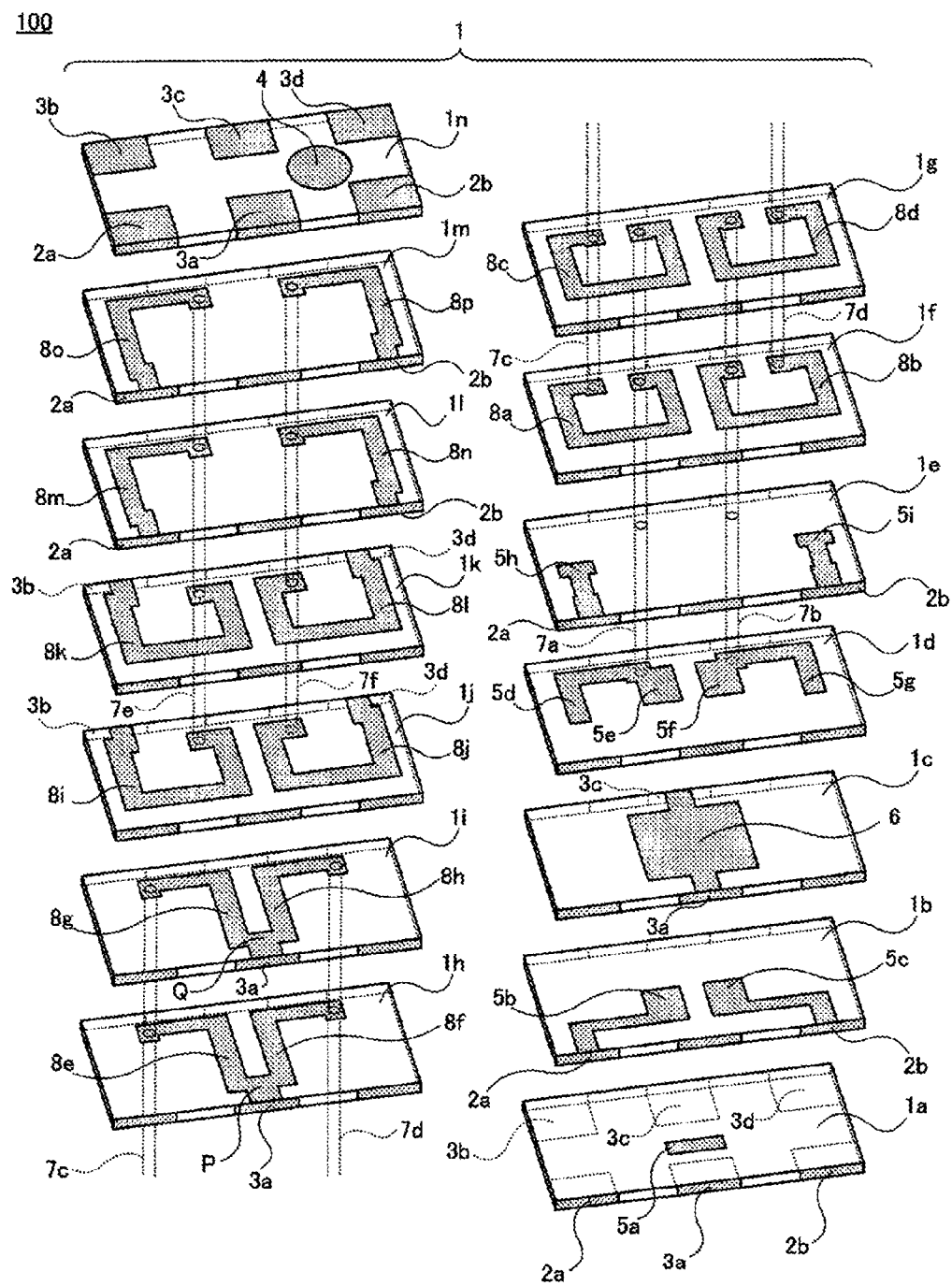
FIG. 2 is an exploded perspective view of the multilayer LC filter 100.
Figure 3:
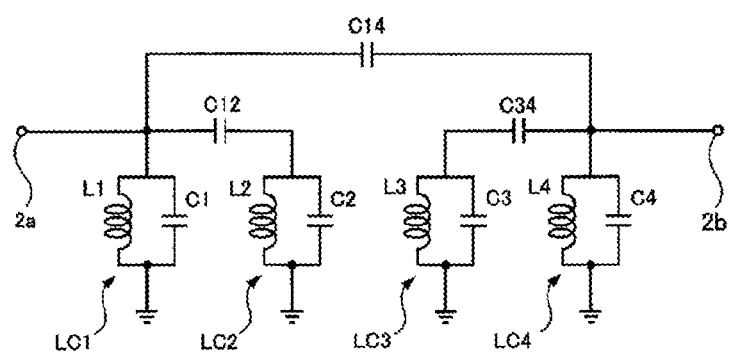
FIG. 3 is an equivalent circuit diagram of the multilayer LC filter 100.

A multilayer LC filter 100 according to a first preferred embodiment of the present invention is illustrated in FIGS. 1 to 3. Note that FIG. 1 is a perspective view of the multilayer LC filter 100. FIG. 2 is an exploded perspective view of the multilayer LC filter 100. FIG. 3 is an equivalent circuit diagram of the multilayer LC filter 100.

The multilayer LC filter 100 includes a multilayer body 1. On an outer surface of the multilayer body 1, a first input/output terminal 2a, a second input/output terminal 2b, and four ground terminals 3a, 3b, 3c and 3d are preferably provided. More specifically, the first input/output terminal 2a, the ground terminal 3a, and the second input/output terminal 2b are provided on a side surface of the multilayer body 1 on the front side in FIG. 1. The ground terminal 3b, the ground terminal 3c, and the ground terminal 3d are provided on a side surface of the multilayer body 1 on the rear side in FIG. 1.

Each of the first input/output terminal 2a, the second input/output terminal 2b, and the ground terminals 3a, 3b, 3c and 3d is configured with one end thereof being extended to a lower-side main surface of the multilayer body 1, and the other end thereof being extended to an upper-side main surface of the multilayer body 1. Further, a mark 4 indicating directivity of the multilayer body 1 is provided on the upper-side main surface of the multilayer body 1.

As illustrated in FIG. 2, for example, the multilayer body 1 is preferably provided by laminating 14 layers, that is, dielectric layers 1a to 1n made of ceramic or other suitable material, for example, in sequence from the bottom. On a lower-side main surface and a side surface of the dielectric layer 1a, the first input/output terminal 2a, the second input/output terminal 2b, and the ground terminals 3a, 3b, 3c and 3d are provided. Note that, also in the dielectric layers 1b to 1n to be explained below, the first input/output terminal 2a, the second input/output terminal 2b, and the ground terminals 3a, 3b, 3c and 3d are provided on side surfaces thereof, but the description thereof and the assignment of reference signs to the drawings may be omitted when there is no particular need for such descriptions.

In addition, a capacitor conductor pattern 5a is provided on an upper-side main surface of the dielectric layer 1a. Further, two capacitor conductor patterns 5b and 5c are provided on an upper-side main surface of the dielectric layer 1b. The capacitor conductor pattern 5b is connected to the first input/output terminal 2a provided on a side surface of the dielectric layer 1b. The capacitor conductor pattern 5c is connected to the second input/output terminal 2b provided on the side surface of the dielectric layer 1b.

A ground conductor pattern 6 is provided on an upper-side main surface of the dielectric layer 1c. The ground conductor pattern 6 is connected to the ground terminal 3a and the ground terminal 3c each provided on a side surface of the dielectric layer 1c.

Four capacitor conductor patterns 5d, 5e, 5f and 5g are provided on an upper-side main surface of the dielectric layer 1d. The capacitor conductor pattern 5d and the capacitor conductor pattern 5e are connected to each other. The capacitor conductor pattern 5f and the capacitor conductor pattern 5g are connected to each other.

Two via conductors 7a and 7b are provided in the dielectric layer 1e. The via conductor 7a is connected to the capacitor conductor pattern 5d and the capacitor conductor pattern 5e. The via conductor 7b is connected to the capacitor conductor pattern 5f and the capacitor conductor pattern 5g.

Two capacitor conductor patterns 5h and 5i are provided on an upper-side main surface of the dielectric layer 1e. The capacitor conductor pattern 5h is connected to the first input/output terminal 2a provided on a side surface of the dielectric layer 1e. The capacitor conductor pattern 5i is connected to the second input/output terminal 2b provided on the side surface of the dielectric layer 1e.

The above-described two via conductors 7a and 7b are provided in the dielectric layer 1f. As described above, the via conductors provided in different dielectric layers and having the same reference signs are connected to each other, respectively.

Two inductor conductor patterns 8a and 8b are provided on an upper-side main surface of the dielectric layer 1f. One end of the inductor conductor pattern 8a is connected to the via conductor 7a. One end of the inductor conductor pattern 8b is connected to the via conductor 7b.

The above-described two via conductors 7a and 7b are provided in the dielectric layer 1g. Two via conductors 7c and 7d are additionally provided in the dielectric layer 1g. The via conductor 7c is connected to the other end of the inductor conductor pattern 8a. The via conductor 7d is connected to the other end of the inductor conductor pattern 8b.

In addition, two inductor conductor patterns 8c and 8d are provided on an upper-side main surface of the dielectric layer 1g. One end of the inductor conductor pattern 8c is connected to the via conductor 7a, and the other end thereof is connected to the via conductor 7c. One end of the inductor conductor pattern 8d is connected to the via conductor 7b, and the other end thereof is connected to the via conductor 7d. The two via conductors 7c and 7d are provided in the dielectric layer 1h.

Further, two inductor conductor patterns 8e and 8f are preferably provided on an upper-side main surface of the dielectric layer 1h. One end of the inductor conductor pattern 8e is connected to the via conductor 7c. One end of the inductor conductor pattern 8f is connected to the via conductor 7d. The other end of the inductor conductor pattern 8e and the other end of the inductor conductor pattern 8f are connected to each other at a point P, and are connected to the ground terminal 3a provided on a side surface of the dielectric layer 1h. The two via conductors 7c and 7d are provided in the dielectric layer 1i.

Further, two inductor conductor patterns 8g and 8h are provided on an upper-side main surface of the dielectric layer 1i. One end of the inductor conductor pattern 8g is connected to the via conductor 7c. One end of the inductor conductor pattern 8h is connected to the via conductor 7d. The other end of the inductor conductor pattern 8g and the other end of the inductor conductor pattern 8h are connected to each other at a point Q, and are connected to the ground terminal 3a provided on a side surface of the dielectric layer 1i.

Two inductor conductor patterns 8i and 8j are provided on an upper-side main surface of the dielectric layer 1j. One end of the inductor conductor pattern 8i is connected to the ground terminal 3b provided on a side surface of the dielectric layer 1j. One end of the inductor conductor pattern 8j is connected to the ground terminal 3d provided on the side surface of the dielectric layer 1j.

Two via conductors 7e and 7f are additionally provided in the dielectric layer 1k. The via conductor 7e is connected to the other end of the inductor conductor pattern 8i. The via conductor 7f is connected to the other end of the inductor conductor pattern 8j.

Two inductor conductor patterns 8k and 8l are provided on an upper-side main surface of the dielectric layer 1k. One end of the inductor conductor pattern 8k is connected to the ground terminal 3b provided on a side surface of the dielectric layer 1k. The other end of the inductor conductor pattern 8k is connected to the via conductor 7e. One end of the inductor conductor pattern 8l is connected to the ground terminal 3d provided on the side surface of the dielectric layer 1k. The other end of the inductor conductor pattern 8l is connected to the via conductor 7f. The two via conductors 7e and 7f are provided in the dielectric layer 1l.

Two inductor conductor patterns 8m and 8n are provided on an upper-side main surface of the dielectric layer 1l. One end of the inductor conductor pattern 8m is connected to the first input/output terminal 2a provided on a side surface of the dielectric layer 1l. The other end of the inductor conductor pattern 8m is connected to the via conductor 7e. One end of the inductor conductor pattern 8n is connected to the second input/output terminal 2b provided on the side surface of the dielectric layer 1l. The other end of the inductor conductor pattern 8n is connected to the via conductor 7f. The two via conductors 7e and 7f are provided in the dielectric layer 1m.

Two inductor conductor patterns 8o and 8p are provided on an upper-side main surface of the dielectric layer 1m. One end of the inductor conductor pattern 8o is connected to the first input/output terminal 2a provided on a side surface of the dielectric layer 1m. The other end of the inductor conductor pattern 8o is connected to the via conductor 7e. One end of the inductor conductor pattern 8p is connected to the second input/output terminal 2b provided on the side surface of the dielectric layer 1m. The other end of the inductor conductor pattern 8p is connected to the via conductor 7f.

On an upper-side main surface and a side surface of the dielectric layer 1n, the first input/output terminal 2a, the second input/output terminal 2b, and the ground terminals 3a, 3b, 3c and 3d are provided. The mark 4 is provided on the upper-side main surface of the dielectric layer 1n.

The multilayer LC filter 100 having the above-described structure is able to be manufactured using a material and a manufacturing method widely used in the known multilayer LC filters.

The multilayer LC filter 100 is provided with an equivalent circuit illustrated in FIG. 3.

In the multilayer LC filter 100, a first LC parallel resonator LC1 including a first inductor L1 and a first capacitor C1 connected in parallel, a second LC parallel resonator LC2 including a second inductor L2 and a second capacitor C2 connected in parallel, a third LC parallel resonator LC3 including a third inductor L3 and a third capacitor C3 connected in parallel, and a fourth LC parallel resonator LC4 including a fourth inductor L4 and a fourth capacitor C4 connected in parallel, are provided in this order between the first input/output terminal 2a and the second input/output terminal 2b. Then, the first inductor L1 and the second inductor L2 are magnetically coupled to each other, the second inductor L2 and the third inductor L3 are magnetically coupled to each other, and the third inductor L3 and the fourth inductor L4 are magnetically coupled to each other. Further, the first LC parallel resonator LC1 and the second LC parallel resonator LC2 are capacitively coupled by a capacitor C12. The third LC parallel resonator LC3 and the fourth LC parallel resonator LC4 are capacitively coupled by a capacitor C34. The first LC parallel resonator LC1 and the fourth LC parallel resonator LC4 are capacitively coupled by a capacitor C14.

Further, in the multilayer LC filter 100, the first inductor L1 and the third inductor L3 are magnetically coupled to each other, the first inductor L1 and the fourth inductor L4 are magnetically coupled to each other, and the second inductor L2 and the fourth inductor L4 are magnetically coupled to each other.

The multilayer LC filter 100 provided with the above-described equivalent circuit provides a four-stage band pass filter having desired frequency characteristics.

Next, a relationship between the structure and the equivalent circuit of the multilayer LC filter 100 will be described.

The first inductor L1 of the first LC parallel resonator LC1 is defined by a conductor line connecting the inductor conductor patterns 8m and 8o, the via conductor 7e, and the inductor conductor patterns 8i and 8k. The inductor conductor patterns 8m and 8o are connected to the first input/output terminal 2a. Further, the inductor conductor patterns 8i and 8k are connected to the ground terminal 3b. In the first inductor L1, by connecting the inductor conductor patterns 8m and 8o as a set, and connecting the inductor conductor patterns 8i and 8k as a set, internal resistance is reduced and the Q value is correspondingly improved.

The first capacitor C1 of the first LC parallel resonator LC1 is defined by capacitance generated between the capacitor conductor pattern 5b and the ground conductor pattern 6. The capacitor conductor pattern 5b is connected to the first input/output terminal 2a.

The capacitor C12 capacitively coupling the first LC parallel resonator LC1 and the second LC parallel resonator LC2 is defined by capacitance generated between the capacitor conductor pattern 5h and the capacitor conductor pattern 5d. The capacitor conductor pattern 5h is connected to the first input/output terminal 2a.

The second inductor L2 of the second LC parallel resonator LC2 is defined by a conductor line connecting the via conductor 7a, the inductor conductor patterns 8a and 8c, the via conductor 7c, and the inductor conductor patterns 8e and 8g. The via conductor 7a is connected to the capacitor conductor pattern 5d which is one electrode of the capacitor C12 capacitively coupling the first LC parallel resonator LC1 and the second LC parallel resonator LC2. The inductor conductor patterns 8e and 8g are connected to the ground terminal 3a via the points P and Q. In the second inductor L2, by connecting the inductor conductor patterns 8a and 8c as a set, and connecting the inductor conductor patterns 8e and 8g as a set, internal resistance is reduced and the Q value is correspondingly improved.

The second capacitor C2 of the second LC parallel resonator LC2 is defined by capacitance generated between the capacitor conductor pattern 5e and the ground conductor pattern 6. The capacitor conductor pattern 5e is connected to the capacitor conductor pattern 5d, which is the one electrode of the capacitor C12 capacitively coupling the first LC parallel resonator LC1 and the second LC parallel resonator LC2.

The third inductor L3 of the third LC parallel resonator LC3 is defined by a conductor line connecting the via conductor 7b, the inductor conductor patterns 8b and 8d, the via conductor 7d, and the inductor conductor patterns 8f and 8h. The via conductor 7b is connected to the capacitor conductor pattern 5g which is one electrode of the capacitor C34 to be explained later configured to capacitively couple the third LC parallel resonator LC3 and the fourth LC parallel resonator LC4. The inductor conductor patterns 8f and 8h are connected to the ground terminal 3a via the points P and Q. In the third inductor L3, by connecting the inductor conductor patterns 8b and 8d as a set, and connecting the inductor conductor patterns 8f and 8h as a set, internal resistance is lowered and the Q value is correspondingly improved.

The third capacitor C3 of the third LC parallel resonator LC3 is defined by capacitance generated between the capacitor conductor pattern 5f and the ground conductor pattern 6. The capacitor conductor pattern 5f is connected to the capacitor conductor pattern 5g which is the one electrode of the capacitor C34 to be explained later configured to capacitively couple the third LC parallel resonator LC3 and the fourth LC parallel resonator LC4.

The capacitor C34 capacitively coupling the third LC parallel resonator LC3 and the fourth LC parallel resonator LC4 is defined by capacitance generated between the capacitor conductor pattern 5i and the capacitor conductor pattern 5g. The capacitor conductor pattern 5i is connected to the first input/output terminal 2a. As described above, the capacitor conductor pattern 5g is connected to the via conductor 7b and the capacitor conductor pattern 5f.

The fourth inductor L4 of the fourth LC parallel resonator LC4 is defined by a conductor line connecting the inductor conductor patterns 8n and 8p, the via conductor 7f, and the inductor conductor patterns 8j and 8l. The inductor conductor patterns 8n and 8p are connected to the second input/output terminal 2b. Further, the inductor conductor patterns 8j and 8l are connected to the ground terminal 3d.

In the fourth inductor L4, by connecting the inductor conductor patterns 8n and 8p as a set, and connecting the inductor conductor patterns 8j and 8l as a set, internal resistance is reduced and the Q value is correspondingly improved.

The fourth capacitor C4 of the fourth LC parallel resonator LC4 is defined by capacitance generated between the capacitor conductor pattern 5c and the ground conductor pattern 6. The capacitor conductor pattern 5c is connected to the second input/output terminal 2b.

The capacitor C14 capacitively coupling the first LC parallel resonator LC1 and the fourth LC parallel resonator LC4 is defined by capacitance generated between the capacitor conductor pattern 5b and the capacitor conductor pattern 5c with the capacitor conductor pattern 5a interposed therebetween. As described above, the capacitor conductor pattern 5b is connected to the first input/output terminal 2a, and the capacitor conductor pattern 5c is connected to the second input/output terminal 2b.

The multilayer LC filter 100 according to the first preferred embodiment having the above-described structure and equivalent circuit includes the following features.

Figure 4A:
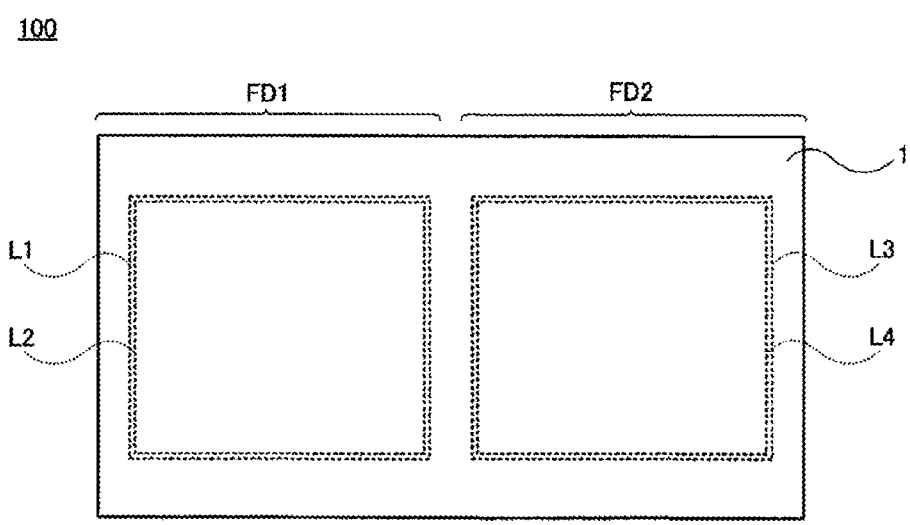
FIG. 4A is a see-through plan view of the multilayer LC filter 100.
Figure 4B:
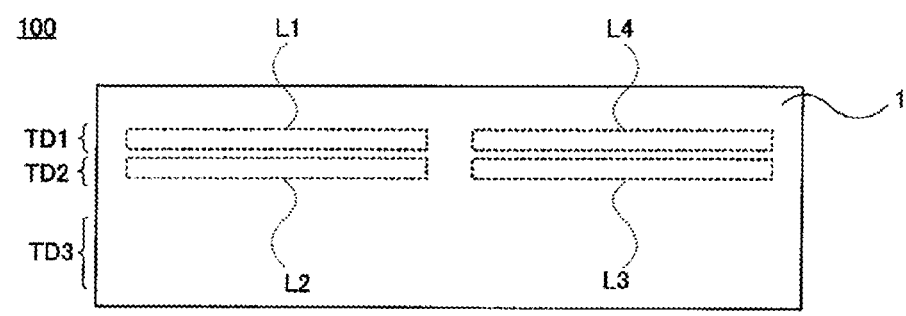
FIG. 4B is a see-through side view of the multilayer LC filter 100.

FIGS. 4A and 4B illustrate formation positions of the first inductor L1, the second inductor L2, the third inductor L3, and the fourth inductor L4 inside the multilayer body 1 in the multilayer LC filter 100. Note that FIG. 4A is a see-through plan view of the multilayer LC filter 100, and FIG. 4B is a see-through side view of the multilayer LC filter 100.

As illustrated in FIG. 4A, the multilayer body 1 of the multilayer LC filter 100 includes a first planar region FD1 and a second planar region FD2 when viewed in the lamination direction of the dielectric layers 1a to 1n. Then, the first inductor L1 and the second inductor L2 are provided in the first planar region FD1. The third inductor L3 and the fourth inductor L4 are provided in the second planar region FD2.

As illustrated in FIG. 4B, the multilayer body 1 of the multilayer LC filter 100 preferably includes a first thickness region TD1, a second thickness region TD2, and a third thickness region TD3 in sequence from the top when viewed in a direction perpendicular or substantially perpendicular to the lamination direction of the dielectric layers 1a to 1n. The first inductor L1 and the fourth inductor L4 are provided in the first thickness region TD1. The second inductor L2 and the third inductor L3 are provided in the second thickness region TD2. Although not specifically illustrated, the first capacitor C1, the second capacitor C2, the third capacitor C3, the fourth capacitor C4, the capacitor C12, the capacitor C34, and the capacitor C14 are preferably provided in the third thickness region TD3.

The first inductor L1 and the second inductor L2 are magnetically coupled to each other, because they are disposed one above the other and the air-core portions thereof overlap each other.

The second inductor L2 and the third inductor L3 are magnetically coupled to each other, because they are aligned side by side in a planar direction, the inductor conductor pattern 8e of the second inductor L2 and the inductor conductor pattern 8f of the third inductor L3 are connected at the point P and then connected to the ground terminal 3a, and the inductor conductor pattern 8g of the second inductor L2 and the inductor conductor pattern 8h of the third inductor L3 are connected at the point Q and then connected to the ground terminal 3a. In the multilayer LC filter 100, the magnetic coupling between the second inductor L2 and the third inductor L3 is strengthened to widen the bandwidth of the pass band by a method in which the inductor conductor pattern 8e of the second inductor L2 and the inductor conductor pattern 8f of the third inductor L3 are connected to each other, the inductor conductor pattern 8g of the second inductor L2 and the inductor conductor pattern 8h of the third inductor L3 are connected to each other, and then these conductor patterns are connected to the ground terminal 3a.

The third inductor L3 and the fourth inductor L4 are magnetically coupled to each other, because they are disposed one above the other and the air-core portions thereof overlap each other.

The first inductor L1 and the fourth inductor L4 are magnetically coupled to each other, because they are aligned in the planar direction and close to each other.

Further, the first inductor L1 and the third inductor L3 are magnetically coupled to each other, because, although these inductors are provided on different layers, they are aligned in the planar direction and close to each other.

Furthermore, the second inductor L2 and the fourth inductor L4 are magnetically coupled to each other, because, although these inductors are provided on different layers, they are aligned in the planar direction and close to each other.

As described above, the multilayer LC filter 100 exhibits basic frequency characteristics as a band pass filter by magnetically coupling the first inductor L1 and the second inductor L2, the second inductor L2 and the third inductor L3, and the third inductor L3 and the fourth inductor L4.

In the multilayer LC filter 100, by magnetically coupling the first and third inductors L1 and L3, and by magnetically coupling the second and fourth inductors L2 and L4, a desired pole is provided in the frequency characteristics, and input/output impedance is matched. Moreover, in the multilayer LC filter 100, a desired pole is provided in the frequency characteristics by magnetically coupling the first inductor L1 and the fourth inductor L4.

In addition, in the multilayer LC filter 100, the first inductor L1 provided in the first thickness region TD1 and the first capacitor C1 provided in the third thickness region of the first LC parallel resonator LC1 are connected via the first input/output terminal 2a and the ground terminal 3b provided on the outer surface of the multilayer body 1. In a case in which the first inductor L1 and the first capacitor C1 are connected by a via conductor additionally provided in the second thickness region TD2, since the space is occupied by the additionally provided via conductor, there arises a problem that the second inductor L2 must be miniaturized resulting in the inductance value of the second inductor L2 being decreased. However, the above problem is overcome in the multilayer LC filter 100 by connecting the first inductor L1 and the first capacitor C1 by the first input/output terminal 2a and the ground terminal 3b provided on the outer surface of the multilayer body 1.

Similarly, in the multilayer LC filter 100, the fourth inductor L4 provided in the first thickness region TD1 and the fourth capacitor C4 provided in the third thickness region of the fourth LC parallel resonator LC4 are connected via the second input/output terminal 2b and the ground terminal 3d provided on the outer surface of the multilayer body 1. In a case in which the fourth inductor L4 and the fourth capacitor C4 are connected by a via conductor additionally provided inside the second thickness region TD2, since the space is occupied by the additionally provided via conductor, there arises a problem that the third inductor L3 provided in the second thickness region TD2 must be miniaturized resulting in the inductance value of the third inductor L3 being decreased. However, the above problem is overcome in the multilayer LC filter 100 by connecting the fourth inductor L4 and the fourth capacitor C4 by the second input/output terminal 2b and the ground terminal 3d provided on the outer surface of the multilayer body 1.

Figure 5:
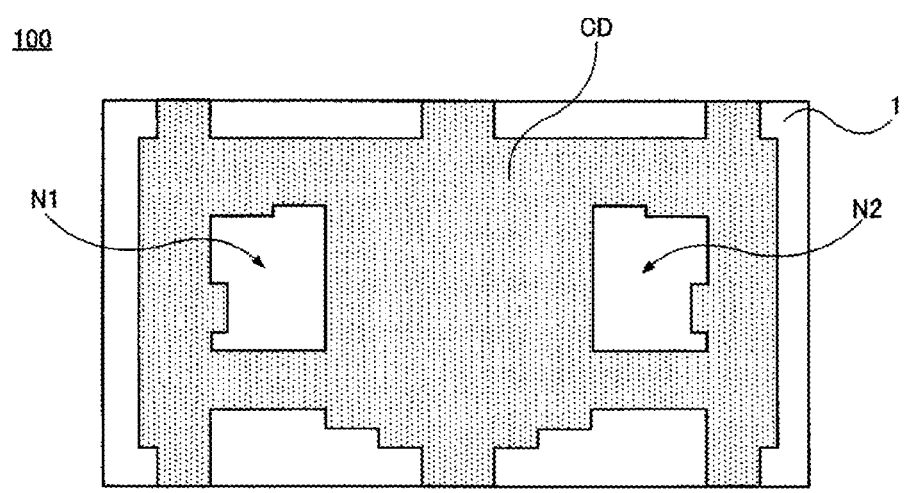
FIG. 5 is a see-through plan view of the multilayer LC filter 100.

In addition, in the multilayer LC filter 100, when the multilayer body 1 is seen in the lamination direction of the dielectric layers 1a to 1n, the air-core portion of the first inductor L1 and the air-core portion of the second inductor L2 overlap each other, and a section in which the air-core portion of the first inductor L1 and the air-core portion of the second inductor L2 overlap each other is not blocked by the capacitor conductor patterns 5a to 5i and the ground conductor pattern 6. Further, the air-core portion of the third inductor L3 and the air-core portion of the fourth inductor L4 overlap each other, and a section where the air-core portion of the third inductor L3 and the air-core portion of the fourth inductor L4 overlap each other is not blocked by the capacitor conductor patterns 5a to 5i and the ground conductor pattern 6. FIG. 5 is a see-through plan view of the multilayer body 1 when seen in the lamination direction of the dielectric layers 1a to 1n. In FIG. 5, a region in which at least one of the capacitor conductor patterns 5a to 5i, the ground conductor pattern 6, and the inductor conductor patterns 8a to 8p is provided is indicated as a conductor-pattern formation region CD. As can be understood from FIG. 5, the conductor-pattern formation region CD includes two portions N1 and N2 at which no conductor-pattern is provided. Then, the portion N1 at which no conductor-pattern is provided overlaps with the air-core portion of the first inductor L1 and the air-core portion of the second inductor L2, and the portion N2 at which no conductor-pattern being provided overlaps with the air-core portion of the third inductor L3 and the air-core portion of the fourth inductor L4. As a result, the magnetic flux generation of the first inductor L1 to fourth inductor L4 is not reduced or prevented by the capacitor conductor patterns 5a to 5i and the ground conductor pattern 6, so that the Q value of each of the first inductor L1 to fourth inductor L4 is large, and the insertion loss of the multilayer LC filter 100 is small.

Figure 6:
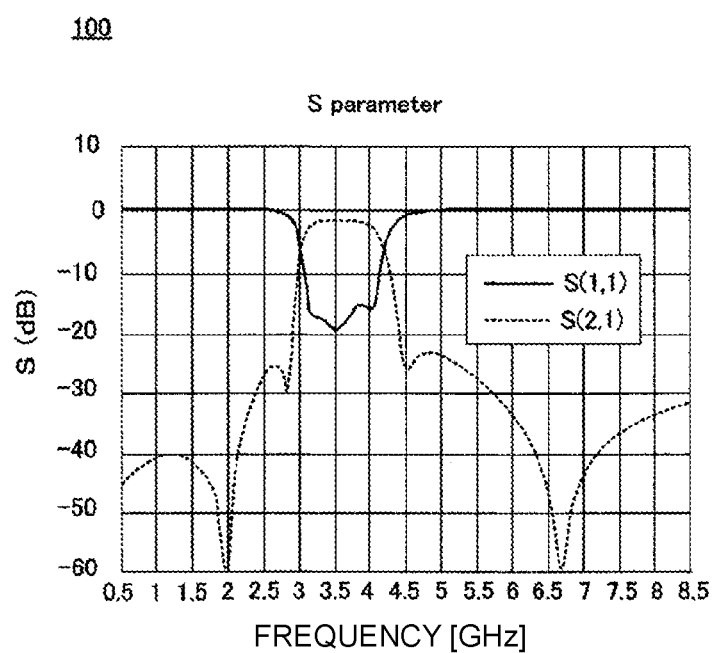
FIG. 6 includes diagrams of frequency characteristics of the multilayer LC filter 100.
Figure 6:
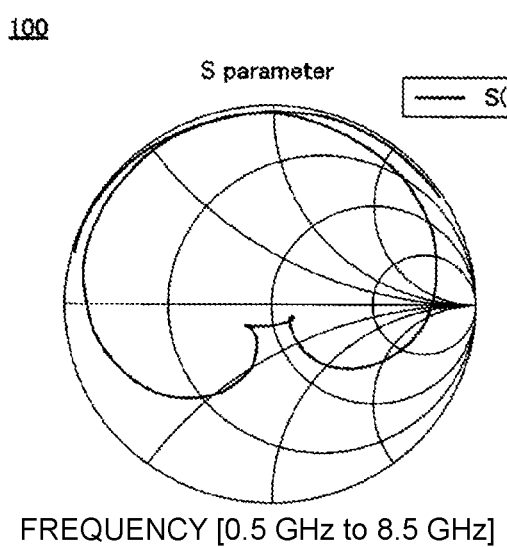

The multilayer LC filter 100 having the above-described structure, equivalent circuit, and features has desired frequency characteristics in which a necessary pole is produced and input/output impedance is matched. FIG. 6 includes diagrams illustrating frequency characteristics of the multilayer LC filter 100. As can be understood from FIG. 6, in the frequency characteristics of the multilayer LC filter 100, poles are produced at a plurality of positions, and input/output impedance matching is achieved.

Moreover, in the multilayer LC filter 100, since the first inductor L1 to fourth inductor L4 are not defined by inductors each including a loop via structure in which the via conductor, the inductor conductor pattern and the via conductor are connected in sequence in a loop shape, the inductance value of each of the first inductor L1 to fourth inductor L4 does not decrease even if the height of the multilayer LC filter 100 is reduced.

Second Preferred Embodiment

Figure 7A:
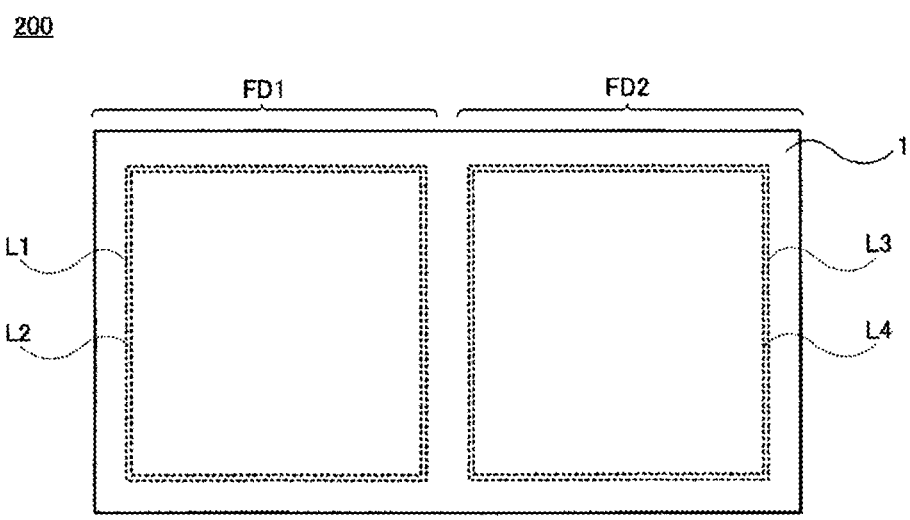
FIG. 7A is a see-through plan view of a multilayer LC filter 200 according to a second preferred embodiment of the present invention.
Figure 7B:
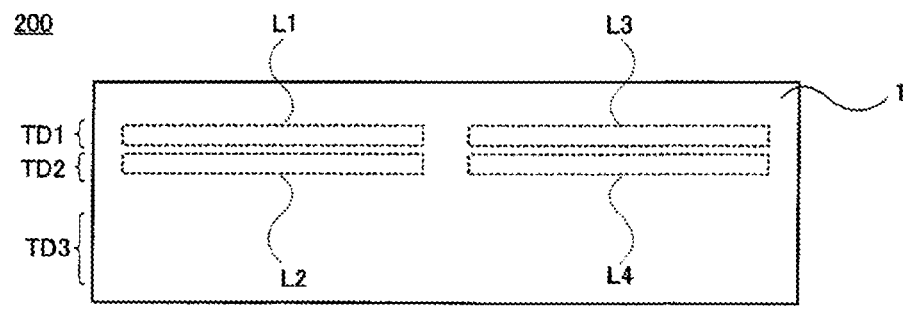
FIG. 7B is a see-through side view of the multilayer LC filter 200.

A multilayer LC filter 200 according to a second preferred embodiment of the present invention is illustrated in FIGS. 7A and 7B. Note that FIG. 7A is a see-through plan view of the multilayer LC filter 200, and FIG. 7B is a see-through side view of the multilayer LC filter 200.

The multilayer LC filter 200 is preferably obtained by modifying the multilayer LC filter 100 according to the first preferred embodiment. Specifically, in the multilayer LC filter 100, the third inductor L3 is provided in the second thickness region TD2, and the fourth inductor L4 is provided in the first thickness region TD1. Conversely, in the multilayer LC filter 200, the third inductor L3 is provided in the first thickness region TD1, and the fourth inductor L4 is provided in the second thickness region TD2, as illustrated in FIG. 7B. In response to this modification, in the multilayer LC filter 200, shapes, positions, and other configurations of some of the capacitor conductor patterns 5a to 5i, the ground conductor pattern 6, and the inductor conductor patterns 8a to 8p are changed. In addition, a portion of the connection relationships of these conductor patterns with respect to the first input/output terminal 2a, the second input/output terminal 2b, and the ground terminals 3a to 3d is changed.

In the multilayer LC filter 100, the following method is preferably used to widen the bandwidth of the pass band: the inductor conductor pattern 8e of the second inductor L2 and the inductor conductor pattern 8f of the third inductor L3 are connected at the point P, the inductor conductor pattern 8g of the second inductor L2 and the inductor conductor pattern 8h of the third inductor L3 are connected at the point Q, and then these conductor patterns are connected to the ground terminal 3a. However, the above-described method is not used in the multilayer LC filter 200. In other words, each of the inductor conductor pattern 8e, the inductor conductor pattern 8f, the inductor conductor pattern 8g and the inductor conductor pattern 8h is individually connected to the ground terminal 3a.

Also in the multilayer LC filter 200, as in the multilayer LC filter 100, the first inductor L1 and the second inductor L2 are magnetically coupled to each other, the second inductor L2 and the third inductor L3 are magnetically coupled to each other, and the third inductor L3 and the fourth inductor L4 are magnetically coupled to each other. In addition, the first inductor L1 and the third inductor L3 are magnetically coupled to each other, the first inductor L1 and the fourth inductor L4 are magnetically coupled to each other, and the second inductor L2 and the fourth inductor L4 are magnetically coupled to each other, such that the multilayer LC filter 200 has desired frequency characteristics in which a necessary pole is provided and input/output impedance is matched.

Third Preferred Embodiment

Figure 8A:
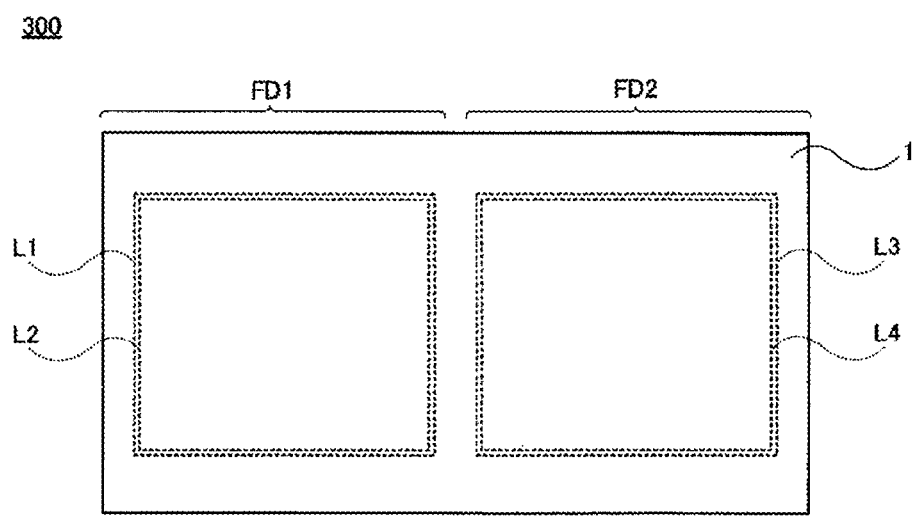
FIG. 8A is a see-through plan view of a multilayer LC filter 300 according to a third preferred embodiment of the present invention.
Figure 8B:
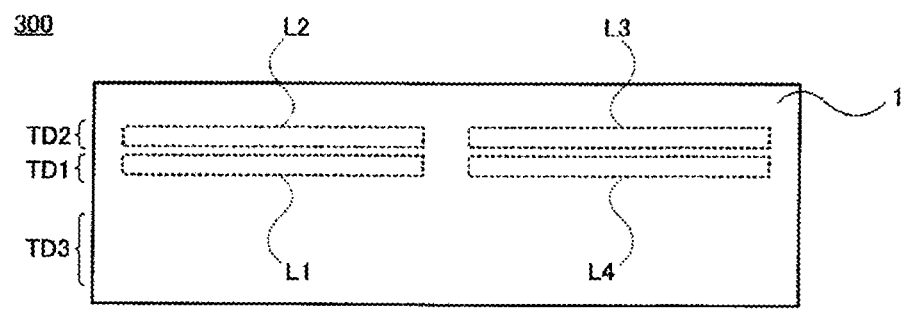
FIG. 8B is a see-through side view of the multilayer LC filter 300.
Figure 9:
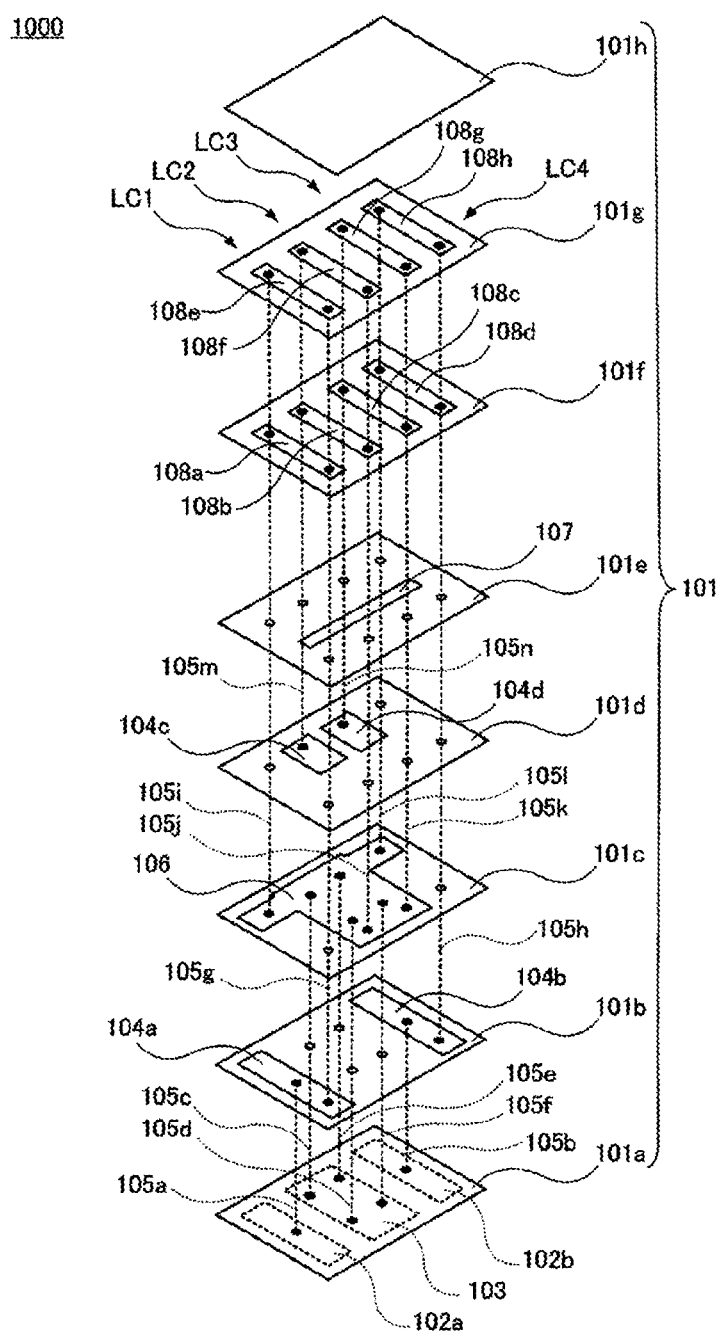
FIG. 9 is an exploded perspective view illustrating a multilayer LC filter 1000 described in Japanese Unexamined Patent Application Publication No. 2014-57277.

A multilayer LC filter 300 according to a third preferred embodiment of the present invention is illustrated in FIGS. 8A and 8B. Note that FIG. 8A is a see-through plan view of the multilayer LC filter 300, and FIG. 8B is a see-through side view of the multilayer LC filter 300.

The multilayer LC filter 300 is also obtained by modifying the multilayer LC filter 100 according to the first preferred embodiment. Specifically, in the multilayer LC filter 100, the first thickness region TD1 is preferably provided on the side closer to one main surface (the upper-side main surface in the drawing) of the multilayer body 1, and the second thickness region TD2 is preferably provided on the interior side of the multilayer body 1; conversely, in the multilayer LC filter 300, the second thickness region TD2 is preferably provided on the side closer to one main surface (the upper-side main surface in the drawing) of the multilayer body 1, and the first thickness region TD1 is preferably provided on the interior side of the multilayer body 1.

Also in the multilayer LC filter 300, as in the multilayer LC filter 100, the first inductor L1 and the second inductor L2 are magnetically coupled to each other, the second inductor L2 and the third inductor L3 are magnetically coupled to each other, and the third inductor L3 and the fourth inductor L4 are magnetically coupled to each other. In addition, the first inductor L1 and the third inductor L3 are magnetically coupled to each other, the first inductor L1 and the fourth inductor L4 are magnetically coupled to each other, and the second inductor L2 and the fourth inductor L4 are magnetically coupled to each other, whereby the multilayer LC filter 300 has desired frequency characteristics in which a necessary pole is formed and input/output impedance is matched.

As described above, the multilayer LC filter 100 according to the first preferred embodiment, the multilayer LC filter 200 according to the second preferred embodiment, and the multilayer LC filter 300 according to the third preferred embodiment have been described. However, the present invention is not limited to the above-described preferred embodiments, and various modifications may be made without departing from the spirit and scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter comprising:
a multilayer body having a rectangular or substantially rectangular parallelepiped shape in which a plurality of dielectric layers are laminated;
a first input/output terminal and a second input/output terminal provided on an outer surface of the multilayer body;
at least one ground terminal provided on the outer surface of the multilayer body;
a plurality of inductor conductor patterns provided in interlaminar areas of the plurality of dielectric layers;
a plurality of capacitor conductor patterns provided in interlaminar areas of the plurality of dielectric layers; and
at least one ground conductor pattern provided in an interlaminar area of the plurality of dielectric layers; wherein
each of a first inductor, a second inductor, a third inductor, and a fourth inductor is defined by at least one of the plurality of inductor conductor patterns;
each of a first capacitor, a second capacitor, a third capacitor, and a fourth capacitor is defined by a capacitance generated between at least one of the plurality of capacitor conductor patterns and the at least one ground conductor pattern;
the first inductor and the first capacitor are connected in parallel to define a first LC parallel resonator, the second inductor and the second capacitor are connected in parallel to define a second LC parallel resonator, the third inductor and the third capacitor are connected in parallel to define a third LC parallel resonator, and the fourth inductor and the fourth capacitor are connected in parallel to define a fourth LC parallel resonator;

the first LC parallel resonator, the second LC parallel resonator, the third LC parallel resonator, and the fourth LC parallel resonator are connected in this order between the first input/output terminal and the second input/output terminal to define a four-stage multilayer LC filter;
the multilayer body includes a first planar region and a second planar region when viewed in a lamination direction of the plurality of dielectric layers;
the multilayer body includes a first thickness region and a second thickness region each having a predetermined thickness in the lamination direction of the plurality of dielectric layers when viewed in a direction perpendicular or substantially perpendicular to the lamination direction of the plurality of dielectric layers;
when the multilayer body is viewed in the lamination direction of the plurality of dielectric layers, the first inductor and the second inductor are provided in the first planar region, and the third inductor and the fourth inductor are provided in the second planar region;
one end of the at least one of the plurality of inductor conductor patterns defining the second inductor and one end of the at least one of the plurality of inductor conductor patterns defining the third inductor are connected to each other, and then connected to the at least one ground terminal;
the multilayer body further includes a third thickness region when viewed in the direction perpendicular or substantially perpendicular to the lamination direction of the plurality of dielectric layers;
the first thickness region, the second thickness region, and the third thickness region are disposed in this order in the lamination direction of the plurality of dielectric layers;
when the multilayer body is viewed in the direction perpendicular or substantially perpendicular to the lamination direction of the plurality of dielectric layers, the first inductor and the fourth inductor are provided in the first thickness region, the second inductor and the third inductor are provided in the second thickness region, and the first capacitor, the second capacitor, the third capacitor and the fourth capacitor are provided in the third thickness region;
the first inductor and the first capacitor of the first LC parallel resonator are connected via the first input/output terminal and the at least one ground terminal respectively provided on the outer surface of the multilayer body; and
the fourth inductor and the fourth capacitor of the fourth LC parallel resonator are connected via the second input/output terminal and the at least one ground terminal respectively provided on the outer surface of the multilayer body.

2. The multilayer LC filter according to claim 1, wherein when the multilayer body is viewed in the lamination direction of the plurality of dielectric layers:
an air-core portion of the first inductor and an air-core portion of the second inductor at least partially overlap each other;
a section in which the air-core portion of the first inductor and the air-core portion of the second inductor overlap each other overlaps neither the plurality of capacitor conductor patterns nor the at least one ground conductor pattern, or overlaps the plurality of capacitor conductor patterns or the at least one ground conductor pattern partially but not completely;

an air-core portion of the third inductor and an air-core portion of the fourth inductor at least partially overlap each other; and a section in which the air-core portion of the third inductor and the air-core portion of the fourth inductor overlap each other overlaps neither the plurality of capacitor conductor patterns nor the at least one ground conductor pattern, or overlaps the plurality of capacitor conductor patterns or the at least one ground conductor pattern partially but not completely.

3. The multilayer LC filter according to claim 1, wherein the first thickness region is provided on a side closer to one main surface of the multilayer body, and the second thickness region is provided on an interior side of the multilayer body.

4. The multilayer LC filter according to claim 3, wherein when the multilayer body is viewed in the lamination direction of the plurality of dielectric layers:
   an air-core portion of the first inductor and an air-core portion of the second inductor at least partially overlap each other;
   a section in which the air-core portion of the first inductor and the air-core portion of the second inductor overlap each other overlaps neither the plurality of capacitor conductor patterns nor the at least one ground conductor pattern, or overlaps the plurality of capacitor conductor patterns or the at least one ground conductor pattern partially but not completely;
   an air-core portion of the third inductor and an air-core portion of the fourth inductor at least partially overlap each other; and
   a section in which the air-core portion of the third inductor and the air-core portion of the fourth inductor overlap each other overlaps neither the plurality of capacitor conductor patterns nor the at least one ground conductor pattern, or overlaps the plurality of capacitor conductor patterns or the at least one ground conductor pattern partially but not completely.

5. A multilayer LC filter comprising:
   a multilayer body having a rectangular or substantially rectangular parallelepiped shape in which a plurality of dielectric layers are laminated;
   a first input/output terminal and a second input/output terminal provided on an outer surface of the multilayer body;
   at least one ground terminal provided on the outer surface of the multilayer body;
   a plurality of inductor conductor patterns provided in interlaminar areas of the plurality of dielectric layers;
   a plurality of capacitor conductor patterns provided in interlaminar areas of the plurality of dielectric layers; and
   at least one ground conductor pattern provided in an interlaminar area of the plurality of dielectric layers; wherein
   each of a first inductor, a second inductor, a third inductor, and a fourth inductor is defined by at least one of the plurality of inductor conductor patterns;
   each of a first capacitor, a second capacitor, a third capacitor, and a fourth capacitor is defined by a capacitance generated between at least one of the plurality of capacitor conductor patterns and the at least one ground conductor pattern;
   the first inductor and the first capacitor are connected in parallel to define a first LC parallel resonator, the second inductor and the second capacitor are connected in parallel to define a second LC parallel resonator, the third inductor and the third capacitor are connected in parallel to define a third LC parallel resonator, and the fourth inductor and the fourth capacitor are connected in parallel to define a fourth LC parallel resonator;
   the first LC parallel resonator, the second LC parallel resonator, the third LC parallel resonator, and the fourth LC parallel resonator are connected in this order between the first input/output terminal and the second input/output terminal to define a four-stage multilayer LC filter;
   the multilayer body includes a first planar region and a second planar region when viewed in a lamination direction of the plurality of dielectric layers;
   the multilayer body includes a first thickness region and a second thickness region each having a predetermined thickness in the lamination direction of the plurality of dielectric layers when viewed in a direction perpendicular or substantially perpendicular to the lamination direction of the plurality of dielectric layers;
   when the multilayer body is viewed in the lamination direction of the plurality of dielectric layers, the first inductor and the second inductor are provided in the first planar region, and the third inductor and the fourth inductor are provided in the second planar region;
   the multilayer body further includes a third thickness region when viewed in the direction perpendicular or substantially perpendicular to the lamination direction of the plurality of dielectric layers;
   the first thickness region, the second thickness region, and the third thickness region are disposed in this order in the lamination direction of the plurality of dielectric layers;
   when the multilayer body is viewed in the direction perpendicular or substantially perpendicular to the lamination direction of the plurality of dielectric layers, the first inductor and the fourth inductor are provided in the first thickness region, the second inductor and the third inductor are provided in the second thickness region, and the first capacitor, the second capacitor, the third capacitor and the fourth capacitor are provided in the third thickness region;
   the first inductor and the first capacitor of the first LC parallel resonator are connected via the first input/output terminal and the at least one ground terminal respectively provided on the outer surface of the multilayer body;
   the fourth inductor and the fourth capacitor of the fourth LC parallel resonator are connected via the second input/output terminal and the at least one ground terminal respectively provided on the outer surface of the multilayer body;
   when the multilayer body is viewed in the lamination direction of the plurality of dielectric layers:
      an air-core portion of the first inductor and an air-core portion of the second inductor at least partially overlap each other;
      a section in which the air-core portion of the first inductor and the air-core portion of the second inductor overlap each other overlaps neither the plurality of capacitor conductor patterns nor the at least one ground conductor pattern, or overlaps the plurality of capacitor conductor patterns or the at least one ground conductor pattern partially but not completely;

an air-core portion of the third inductor and an air-core portion of the fourth inductor at least partially overlap each other; and a section in which the air-core portion of the third inductor and the air-core portion of the fourth inductor overlap each other overlaps neither the plurality of capacitor conductor patterns nor the at least one ground conductor pattern, or overlaps the plurality of capacitor conductor patterns or the at least one ground conductor pattern partially but not completely.

6. The multilayer LC filter according to claim 5, wherein the first thickness region is provided on a side closer to one main surface of the multilayer body, and the second thickness region is provided on an interior side of the multilayer body.

* * * * *